US009812295B1

(12) United States Patent
Stowell (10) Patent No.: US 9,812,295 B1
(45) Date of Patent: Nov. 7, 2017

(54) MICROWAVE CHEMICAL PROCESSING (71) Applicant: Lyten, Inc., Sunnyvale, CA (US)

(72) Inventor: Michael W. Stowell, Sunnyvale, CA (US)

(73) Assignee: Lyten, Inc., Sunnyvale, CA (US)

( * ) Notice: Subject to any disclaimer, the term of this patent is extended or adjusted under 35 U.S.C. 154(b) by 0 days.

(21) Appl. No.: 15/351,858

(22) Filed: Nov. 15, 2016

(51) Int. Cl.
*H01J 37/32* (2006.01)
*C01B 31/02* (2006.01)
(Continued)

(52) U.S. Cl.
CPC .... *H01J 37/32192* (2013.01); *H01J 37/3244* (2013.01); *B82Y 40/00* (2013.01); *C01B 31/022* (2013.01); *C01B 31/024* (2013.01); *C01B 31/0206* (2013.01); *C01B 31/0213* (2013.01); *C01B 31/0293* (2013.01);
(Continued)

(58) Field of Classification Search
CPC ............. H01J 37/32192; H01J 37/3244; H01J 2237/332; H01J 2237/334; C01B 31/04; C01B 31/0446; C01B 31/0293; C01B 31/0213; C01B 31/024; C01B 31/022; C01B 31/0206; C23C 16/511; C23C 16/26; C23C 16/453; C23C 16/515; B82Y 40/00; H05H 1/30; H01L 21/32136;
(Continued)

(56) References Cited

U.S. PATENT DOCUMENTS

| 3,706,445 A | 12/1972 | Gentry |
| 5,324,553 A | 6/1994 | Ovshinsky et al. |

(Continued)

FOREIGN PATENT DOCUMENTS

| EP | 0184475 B1 | 5/1989 |
| EP | 1502486 B1 | 11/2011 |

(Continued)

OTHER PUBLICATIONS

Majzlikova, Petra et al, "Sensing Properties of Multiwalled Carbon Nanotubes Grown in MW Plasma Torch: Electronic and Electrochemical Behaviour, Gas Sensing, Field Emission, IR Absorption" Sensors, 15, pp. 2644-1661, published Jan. 26, 2015.*

(Continued)

*Primary Examiner* — Anita Alanko
(74) *Attorney, Agent, or Firm* — The Mueller Law Office, P.C.

(57) ABSTRACT

Methods and systems include supplying pulsed microwave radiation through a waveguide, where the microwave radiation propagates in a direction along the waveguide. A pressure within the waveguide is at least 0.1 atmosphere. A supply gas is provided at a first location along a length of the waveguide, a majority of the supply gas flowing in the direction of the microwave radiation propagation. A plasma is generated in the supply gas, and a process gas is added into the waveguide at a second location downstream from the first location. A majority of the process gas flows in the direction of the microwave propagation at a rate greater than 5 slm. An average energy of the plasma is controlled to convert the process gas into separated components, by controlling at least one of a pulsing frequency of the pulsed microwave radiation, and a duty cycle of the pulsed microwave radiation.

12 Claims, 9 Drawing Sheets

(51) Int. Cl.
| | | |
|---|---|---|
| C01B 31/04 | (2006.01) | |
| C23C 16/511 | (2006.01) | |
| B82Y 40/00 | (2011.01) | |
| C23C 16/26 | (2006.01) | |
| C23C 16/453 | (2006.01) | |
| C23C 16/515 | (2006.01) | |
| H01H 1/30 | (2006.01) | |
| H01L 21/3213 | (2006.01) | |
| H01L 21/02 | (2006.01) | |
| H01L 21/311 | (2006.01) | |
| H01L 21/285 | (2006.01) | |
| H05H 1/30 | (2006.01) | |

(52) U.S. Cl.
CPC .......... *C01B 31/04* (2013.01); *C01B 31/0446* (2013.01); *C23C 16/26* (2013.01); *C23C 16/453* (2013.01); *C23C 16/511* (2013.01); *C23C 16/515* (2013.01); *H01J 2237/332* (2013.01); *H01J 2237/334* (2013.01); *H01L 21/02274* (2013.01); *H01L 21/28556* (2013.01); *H01L 21/31116* (2013.01); *H01L 21/32136* (2013.01); *H05H 1/30* (2013.01)

(58) Field of Classification Search
CPC ......... H01L 21/02274; H01L 21/31116; H01L 21/28556
See application file for complete search history.

(56) References Cited

U.S. PATENT DOCUMENTS

| | | | |
|---|---|---|---|
| 5,515,011 A | 5/1996 | Pasco | |
| 5,556,475 A | 9/1996 | Besen et al. | |
| 5,572,866 A | 11/1996 | Loving | |
| 5,874,705 A | 2/1999 | Duan | |
| 6,337,110 B1* | 1/2002 | Delaunay | C23C 16/26 427/249.6 |
| 6,340,912 B1 | 1/2002 | Gerstenberg et al. | |
| 6,805,779 B2 | 10/2004 | Chistyakov | |
| 6,914,556 B1 | 7/2005 | Nyswander | |
| 7,022,149 B2 | 4/2006 | Krause et al. | |
| 7,102,110 B2 | 9/2006 | Shinohara | |
| 7,608,798 B2 | 10/2009 | Kumar et al. | |
| 7,875,322 B2 | 1/2011 | Kobayashi et al. | |
| 8,034,321 B2 | 10/2011 | Mauthner et al. | |
| 8,075,869 B2 | 12/2011 | Zhu et al. | |
| 8,475,760 B2 | 7/2013 | Rajala et al. | |
| 8,610,353 B2 | 12/2013 | Itoh et al. | |
| 8,636,960 B2* | 1/2014 | Spitzl | B01D 53/32 204/157.43 |
| 8,808,507 B2 | 8/2014 | Kasin | |
| 8,933,629 B2 | 1/2015 | Heil et al. | |
| 8,968,588 B2* | 3/2015 | Zhao | C23C 16/511 216/67 |
| 9,051,185 B2 | 6/2015 | Levendis et al. | |
| 9,293,302 B2 | 3/2016 | Risby et al. | |
| 2003/0138365 A1 | 7/2003 | Obidniak et al. | |
| 2004/0265211 A1 | 12/2004 | Dillon et al. | |
| 2005/0003247 A1 | 1/2005 | Pham | |
| 2008/0029030 A1* | 2/2008 | Goto | H05H 1/24 118/723 R |
| 2008/0176058 A1* | 7/2008 | Maschmann | B82Y 30/00 428/315.5 |
| 2009/0196801 A1 | 8/2009 | Mills | |
| 2009/0220767 A1 | 9/2009 | Bee Binti O A Abd et al. | |
| 2010/0295023 A1* | 11/2010 | Franklin | B82Y 10/00 257/24 |
| 2011/0033639 A1 | 2/2011 | Coll et al. | |
| 2012/0258374 A1 | 10/2012 | Raston et al. | |
| 2013/0270110 A1 | 10/2013 | Sasai et al. | |
| 2014/0208638 A1 | 7/2014 | Thorre et al. | |
| 2014/0263202 A1 | 9/2014 | Partridge | |

FOREIGN PATENT DOCUMENTS

| | | |
|---|---|---|
| EP | 2702839 B1 | 3/2015 |
| JP | 2000150195 A | 5/2000 |
| JP | 2002299323 A | 10/2002 |
| JP | 2012036448 A | 2/2012 |
| WO | 9912184 A2 | 3/1999 |
| WO | 0109031 A1 | 2/2001 |
| WO | 2004092058 A2 | 10/2004 |
| WO | 2015193155 A1 | 12/2015 |

OTHER PUBLICATIONS

"Pyrolytic Carbon," Biomedical Engineering Desk Reference, Oxford, UK: Elsevier, 2009, pp. iii-vi and 267.

Bystrzejewski et al., "Catalyst-free synthesis of onion-like carbon nanoparticles," New Carbon Materials, vol. 25, No. 1, Feb. 2010, p. 1-8.

Cadez et al., "Influence of Hydrocarbons on Vibrational Excitation of H2 Molecules", Nuclear Engineering and Design 241 (2011, p. 1267-1271).

Gicquel et al., "New Driving Parameters for Diamond Deposition Reactors: Pulsed Mode versus Continuous Mode", Materials Research, vol. 6, No. 1, p. 25-37, 2002.

Jasinski et al., "Hydrogen Production via Methane Reforming Using Various Microwave Plasma Sources", Chem. Listy 102, s1332-s1337 (2008).

Konno et al., "Direct Preparation of Hydrogen and Carbon Nanotubes by Microwave Plasma Decomposition of Methane over Fe/Si Activated by Biased Hydrogen Plasma", Green and Sustainable Chemistry, 2012, 3, p. 19-25.

Beeson et al., "Plasma relaxation mechanics of pulsed high power microwave surface flashover," Physics of Plasmas 20, 093509, Sep. 2013, pp. 1-9.

\* cited by examiner

MICROWAVE CHEMICAL PROCESSING

BACKGROUND

Microwave plasmas are used in the industrial chemical processing of gases. This is typically accomplished by flowing the gases to be reacted through an elongated vessel while microwave radiation is coupled into the vessel to generate a plasma. The plasma cracks the gas molecules into component species. Microwave chemical processing systems are effective because microwave plasmas operate at relatively high power coupling efficiencies at low ion energies, and are capable of supporting various gas reactions, such as the conversion of methane into hydrogen and carbon particulates, the conversion of carbon dioxide into oxygen and carbon, and coating particulates and other seed materials with other layers for functionalization and complex layered materials and aggregates processing.

Typical systems for chemical gas processing include a quartz reaction chamber through which process gases flow, and a microwave magnetron source coupled to the reaction chamber through a waveguide. The input microwave radiation can be continuous wave or pulsed. Systems are designed to control the effective coupling of the microwave radiation into the reaction chamber, and the gas flow within the reaction chamber to improve the energy absorption by the flowing gas. Often the systems include a wedge located where the microwave waveguide intersects the quartz reaction chamber, to concentrate the electric field within a small area, and the waveguide conductive walls are not exposed to the gases to be processed.

One example of chemical processing is the microwave processing of methane to produce hydrogen. Methane can be cracked by a plasma into $CH_x$ radicals and H-atoms. When such systems are operated in continuous mode, the H-atom density is mainly controlled by the gas temperature, which is directly related to the microwave power density, and in some cases by diffusion processes. The $CH_x$ radical density, likewise, is controlled by the gas temperature and H-atom concentrations. Alternatively, when such systems are operated in pulsed mode, H-atom and $CH_x$ radical production is controlled by in-pulse power density and its associated higher plasma kinetic energy, which controls gas temperature and thermal dissociation. Typically, during the time the plasma is off the H-atoms recombine and are consumed. Short duty cycles are used to increase the in-pulse power for a constant time-averaged power, and short off-plasma times are used to limit H-atom recombination. Therefore, pulsed systems crack the methane into hydrogen and other hydrocarbon radicals more efficiently (i.e., using less time-averaged input power) than continuous wave systems.

SUMMARY

In methods of the present embodiments, pulsed microwave radiation is supplied through a waveguide having a length, where the microwave radiation propagates in a direction along the waveguide. A pressure within the waveguide is at least 0.1 atmosphere. A supply gas is provided into the waveguide at a first location along a length of the waveguide, where a majority of the supply gas flows in the direction of the microwave radiation propagation. A plasma is generated in the supply gas in at least a portion of the length of the waveguide, and a process gas is added into the waveguide at a second location downstream from the first location. A majority of the process gas flows in the direction of the microwave propagation at a rate greater than 5 slm. An average energy of the plasma is controlled to convert the process gas into separated components, by controlling at least one of i) a pulsing frequency of the pulsed microwave radiation, where the pulsing frequency is greater than 500 Hz; and ii) a duty cycle of the pulsed microwave radiation, where the duty cycle is less than 90%.

In gas processing systems of the present embodiments, the systems include a waveguide having a first gas inlet, a second gas inlet downstream of the first gas inlet, and a length. The first inlet is configured to receive a supply gas, and the second inlet is configured to receive a process gas. A pulsed microwave radiation source is coupled to the waveguide to generate a plasma in the supply gas, where the microwave radiation propagates in a direction along the length of the waveguide to react with the process gas. The microwave radiation source is configured to pulse microwave radiation on and off at a frequency from 500 Hz to 1000 kHz and with a duty cycle less than 90%. the majority of the flow of the supply gas and the majority of the flow of the process gas are parallel to the direction of the microwave propagation. The flow of the process gas is greater than 5 slm, and the waveguide is configured to accommodate pressures of at least 0.1 atmosphere.

DETAILED DESCRIPTION

Reference now will be made to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

The present disclosure relates to microwave plasma chemical processing of hydrocarbon gases. More specifically, the present disclosure relates to microwave plasma chemical processing of hydrocarbon gases using various techniques including pulsing of the microwave radiation to control the energy of the plasma. The ability to control the energy of the plasma enables the selection of one or more reaction pathways in conversion of the hydrocarbon gases into specific separated components. Pulsed microwave radiation can be used to control the energy of the plasma because the short-lived high-energy species that are created when a plasma ignites can be re-generated at the start of each new pulse. The plasma energy is controlled to have a lower average ion energy than conventional techniques, but at a high enough level to enable the targeted chemical reactions to occur at high gas flows and high pressures.

Microwave plasma chemical processing systems using pulsed microwave radiation have been developed that control the energy of the plasma and have very high cracking efficiency, in excess of 90%. These conventional systems, however, use low flow rates, below 1 standard liter per minute (slm), and small gas volumes within the plasma, with a consequence that the production rate is low and the production cost is high. These conventional systems cannot increase the gas flow rate and the gas volume within the plasma while using high frequency microwave pulsing (e.g., above roughly 100 Hz) because the plasma cannot ignite fast enough to keep up with the pulses when a large volume and high flow of gas is used.

Microwave Gas Processing Systems

In the present disclosure, a microwave plasma can be generated in a supply and/or process gas, and the energy in the plasma is sufficient to form separated components from process gas molecules. In some embodiments, a source of microwave radiation is coupled to a reaction chamber, the plasma is generated along a first portion of the length of the reaction chamber, and the process gas is separated into components along a second portion of the length of the reaction chamber. In some embodiments, the microwave radiation is coupled directly into the plasma and not through a dielectric wall as in conventional methods.

Figure 1:
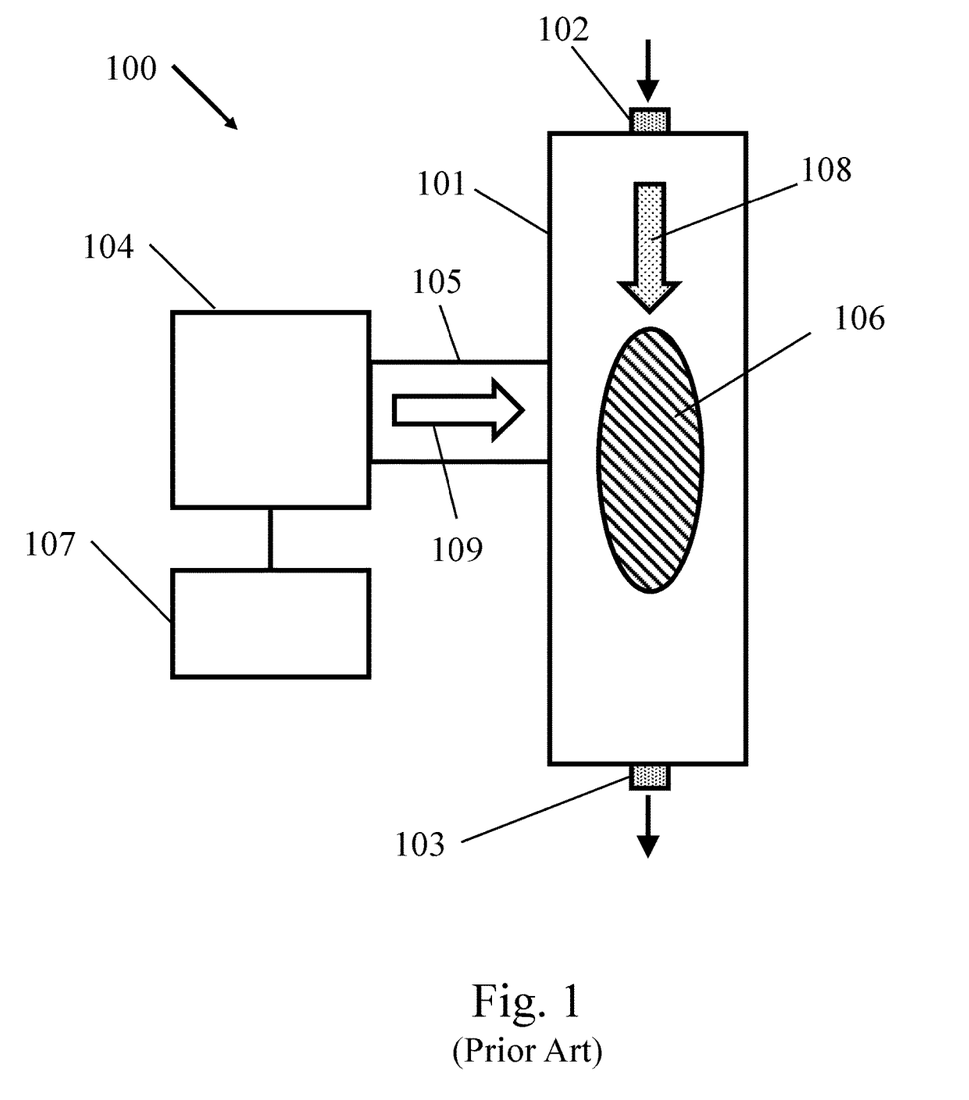
FIG. 1 is a vertical cross-section of a conventional microwave chemical processing system.

FIG. 1 illustrates a conventional microwave chemical processing system. As shown in FIG. 1, a microwave chemical processing system 100 generally includes a reaction chamber 101, one or more gas inlets 102 configured to receive process gas flowing into the reaction chamber, one or more outlets 103 configured to collect separated products out of the reaction chamber 101, and a source of microwave radiation 104 that is coupled to the reaction chamber through a waveguide 105, among other elements not shown for simplicity. The microwave radiation 109 creates a microwave plasma 106 in the reaction chamber 101, and provides energy for reactions to occur. A microwave emitter circuit 107 can control the microwave radiation 109 emitted from the microwave radiation source 104 to be either continuous wave or pulsed. Given the right conditions, the energy in the plasma will be sufficient to form separated components from the process gas molecules.

Parallel Propagation Microwave Gas Processing Systems

Figure 2:
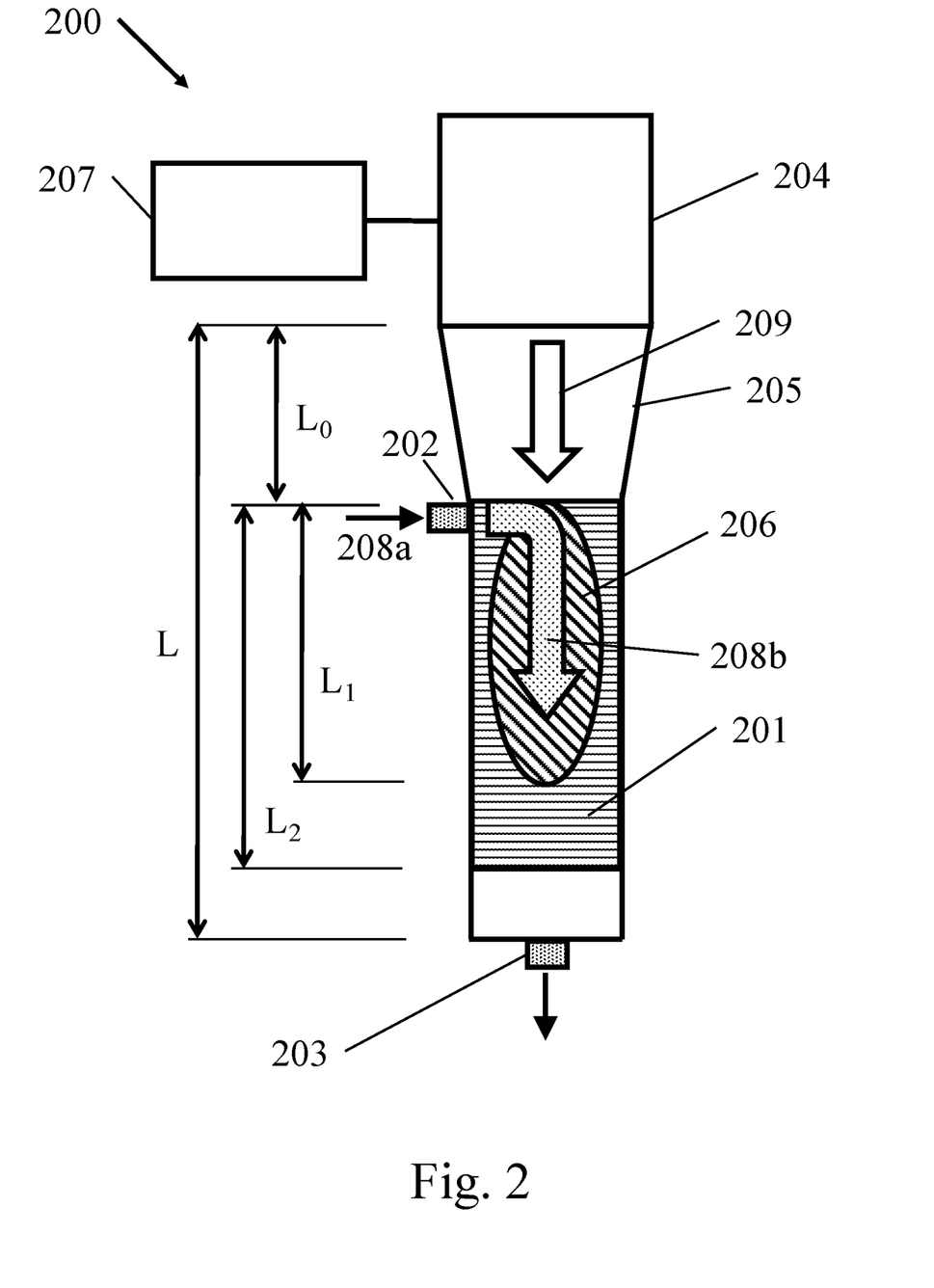
FIG. 2 is a vertical cross-section of a microwave gas processing system in accordance with some embodiments of the present disclosure.
Figure 3:
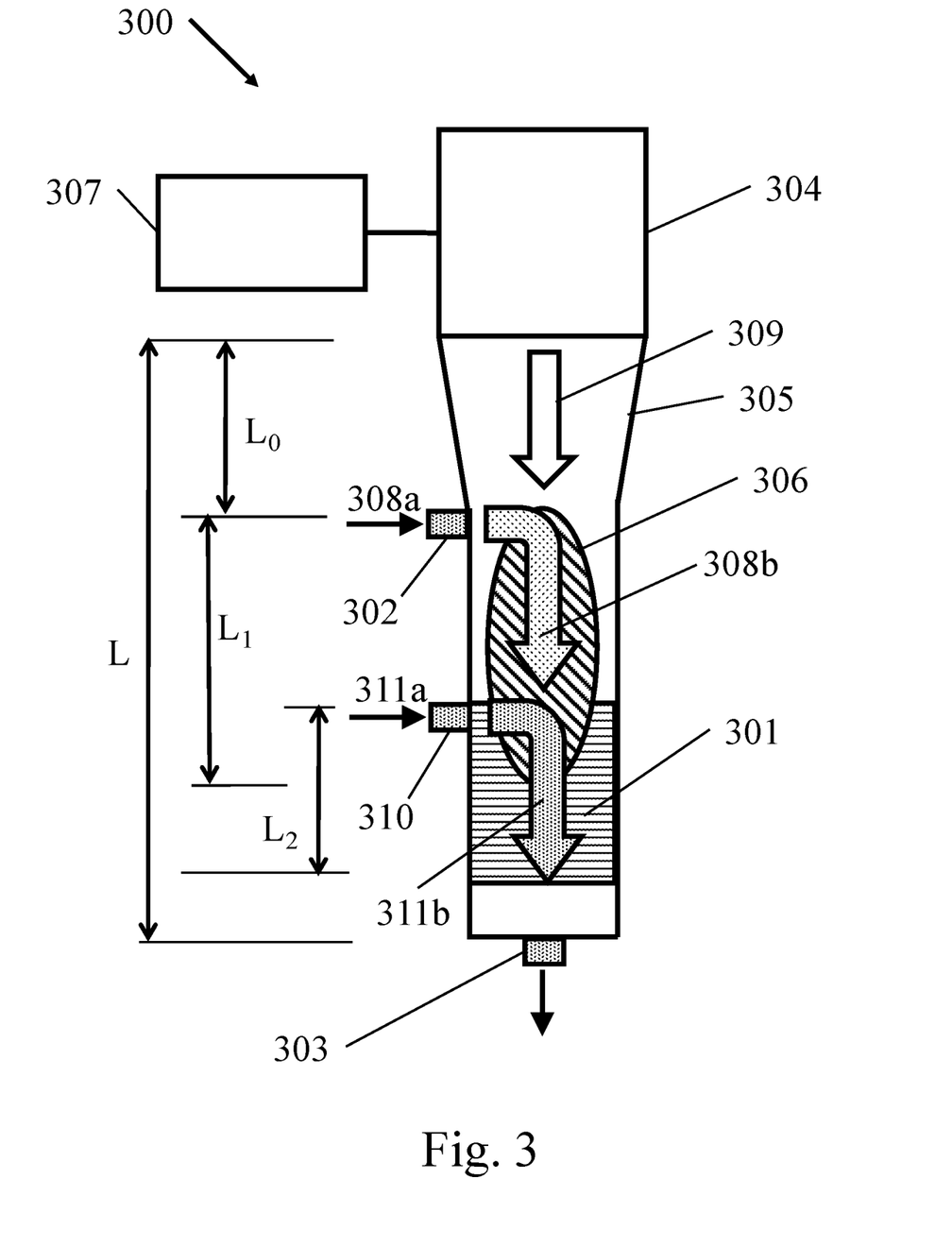
FIG. 3 is a vertical cross-section of a microwave gas processing system in accordance with further embodiments of the present disclosure.

FIGS. 2 and 3 show embodiments of microwave gas processing systems of the present disclosure, in which a waveguide coupled to a microwave source serves as the reaction chamber. The direction of propagation of the microwave radiation is parallel to the majority of the flow of the supply gas and/or the process gas, and the microwave radiation enters the waveguide upstream of the portion of the waveguide where the separated components are generated.

As shown in FIG. 2, a microwave chemical processing system 200, in accordance with some embodiments, generally includes a waveguide 205, one or more gas inlets 202 configured to receive supply gas and/or process gas 208a flowing into the waveguide 205, and a microwave radiation source 204 that is coupled to the waveguide 205, among other elements not shown for simplicity.

In some embodiments, microwave circuit 207 controls a pulsing frequency at which microwave radiation 209 from microwave radiation source 204 is pulsed. In some embodiments, the microwave radiation 209 from microwave radiation source 204 is continuous wave.

The waveguide 205 has a length L. In a portion $L_0$ prior to where the plasma is generated, the cross-sectional area of the waveguide 205 decreases along the path of the microwave propagation. This decrease in area serves to concentrate the electric field, thus increasing the microwave energy density while still providing a significant amount of area in which plasma can be formed compared to conventional systems. For example, the decreased cross-sectional area of portion $L_0$, where the gas inlet 202 is located, may have a rectangular cross-section of dimensions 0.75 inches by 3.4 inches when using a microwave radiation frequency of 2.45 GHz. This cross-sectional area is much greater than conventional systems where the plasma generation area is generally less than one square inch. The dimensions of the waveguide 205 are set according to the microwave frequency, in order to properly function as a waveguide.

In conventional gas processing systems, the limited region in which plasma can form, such as less than one square inch as described above, constrains the volume in which gas reactions can occur. Also, in conventional systems the microwave radiation enters the reaction chamber through a window (typically quartz). In these systems, dielectric materials (e.g., particulate carbon) are coated on the window during processing leading to less and less power delivery over time. This can be highly problematic if these separated components absorb microwave radiation because they can prevent the microwave radiation from coupling into the reaction chamber to generate the plasma. Consequently, a rapid build-up of by-products, such as carbon particles that are produced from the gas reactions, occurs and limits the run-time of the processing equipment. In the present embodiments, the system 200 and other embodiments described below are designed without the use of a window; that is, using a parallel propagation/gas flow system where the radiation enters upstream from the reaction. As a result, more energy and power can be coupled into the plasma from the microwave radiation source. The greater volume within the waveguide 205, compared to limited reaction chamber volumes in conventional systems, greatly reduces the issue of particle build-up causing limited run-times, thus improving production efficiency of the microwave processing system.

The microwave radiation 209 in FIG. 2 creates a microwave plasma 206 in the supply gas and/or process gas within a first portion $L_1$ of the length of the waveguide 205. In some embodiments, a supply gas that is different from the process gas is used to generate the microwave plasma 206. The supply gas may be, for example, hydrogen, helium, a noble gas such as argon, or mixtures of more than one type of gas. In other embodiments, the supply gas is the same as the process gas, where the process gas is the gas from which separated components are being created. In some embodiments, $L_1$ extends from a position along the waveguide downstream from the position where the supply and/or process gas 208a enters the waveguide 205, to the end of the waveguide 205 or to a position between the entrance of the supply and/or process gas and the end of the waveguide 205. In some embodiments, $L_1$ extends from where the supply and/or process gas 208a enters the waveguide 205, to the end of the waveguide 205 or to a position between the entrance of the supply and/or process gas and the end of the waveguide 205. The generated plasma 206 provides energy for reactions to occur in process gas 208b within a second portion 201 of the waveguide 205, the second portion 201 having a length $L_2$. In some embodiments, $L_2$ extends from where the process gas 208a enters the waveguide 205, to the end of the waveguide 205 or to a position between the entrance of the process gas and the end of the waveguide 205. Given the right conditions, the energy in the plasma 206 will be sufficient to form separated components from the process gas molecules. One or more outlets 203 are configured to collect the separated products out of the waveguide 205 downstream of the portion 201 of the waveguide where reactions occur in the process gas 208b. In the example shown in FIG. 2, the propagation direction of the microwave radiation 209 is parallel with the majority of the supply and/or process gas flow 208b, and the microwave radiation 209 enters the waveguide 205 upstream of the portion 201 of the waveguide where the separated components are generated.

In some embodiments, a plasma backstop (not shown) is included in the system to prevent the plasma from propagating to the microwave radiation source 204 or the gas inlet(s) 202. In some embodiments, the plasma backstop is a ceramic or metallic filter with holes to allow the microwave radiation to pass through the plasma backstop, but preventing the majority of the plasma species from passing through. In some embodiments, the majority of the plasma species will be unable to pass the plasma backstop because the holes will have a high aspect ratio, and the plasma species will recombine when they hit the sidewalls of the holes. In some embodiments, the plasma backstop is located between portion $L_0$ and $L_1$, or in portion $L_0$ upstream of portion $L_1$ and downstream of the gas inlet(s) 202 (in an embodiment where gas inlet 202 is within portion $L_0$) and the microwave radiation source 204.

FIG. 3 shows another embodiment of a microwave chemical processing system 300 in which a supply gas and a process gas are injected at different locations. The microwave chemical processing system 300, in accordance with some embodiments, generally includes a waveguide 305, one or more supply gas inlets 302 configured to receive supply gas 308a flowing into the waveguide 305, one or more process gas inlets 310 configured to receive process gas 311a, and a source of microwave radiation 304 that is coupled to the waveguide 305, among other elements not shown for simplicity. The location of process gas inlet 310 is downstream of the location of supply gas inlet 302, where downstream is defined in a direction of the microwave propagation.

In some embodiments, microwave circuit 307 controls a pulsing frequency at which microwave radiation 309 from microwave radiation source 304 is pulsed. In some embodiments, the microwave radiation from radiation source 304 is continuous wave.

The waveguide 305 has a length L. The length $L_0$ of the waveguide where microwave radiation 309 enters has a decreasing cross-sectional area along the direction of the microwave propagation, as described above in relation to FIG. 2. The microwave radiation 309 creates a microwave plasma 306 in the supply gas 308b within a first portion $L_1$ of the length L of the waveguide 305. In some embodiments, $L_1$ extends from a position along the waveguide 305 downstream from the position where the supply gas 308a enters the waveguide 305, to the end of the waveguide 305 or to a position between the entrance of the supply gas and the end of the waveguide 305. In some embodiments, $L_1$ extends from where the supply gas 308a enters the waveguide 305, to the end of the waveguide 305 or to a position between the entrance of the supply gas and the end of the waveguide 205. One or more additional process gas inlets 310 are configured to receive process gas flowing into the waveguide at a second set of locations downstream of the supply gas inlet(s) 302. The generated plasma 306 provides energy for reactions to occur within a second portion 301 of the waveguide 305, the second portion 301 having a length $L_2$. In some embodiments, $L_2$ extends from where the process gas 311a enters the waveguide 305, to the end of the waveguide 305 or to a position between the entrance of the process gas and the end of the waveguide 305. Given the right conditions, the energy in the plasma will be sufficient to form separated components from the process gas molecules. One or more outlets 303 are configured to collect the separated products out of the waveguide 305 downstream of the portion 301 where reactions occur. In the example system 300 shown in FIG. 3, the propagation direction of the microwave radiation 309 is parallel with the majority of the supply gas flow 308b and the process gas flow 311b, and the microwave radiation 309 enters the waveguide 305 upstream of the portion 301 of the waveguide where the separated components are generated.

As described above, the waveguide (e.g., 205 in FIG. 2, and 305 in FIG. 3) has a total length L, a portion of the total length $L_1$ along which the plasma is generated, and a portion of the total length $L_2$ along which the process gas is converted into the separated components. In some embodiments, the total length L of the waveguide is from 1 cm to 1000 cm. In some embodiments, length $L_0$ of the waveguide is from 1 cm to 100 cm. In some embodiments, length $L_1$ of the waveguide is from 1 cm to 100 cm. In some embodiments, length $L_2$ of the waveguide is from 1 cm to 1000 cm. In some embodiments, the total length L of the waveguide is from 30 cm to 60 cm. In some embodiments, length $L_0$ of the waveguide is from 10 cm to 40 cm. In some embodiments, length $L_1$ of the waveguide is from 10 cm to 30 cm. In some embodiments, length $L_2$ of the waveguide is from 5 cm to 20 cm. In some embodiments, length $L_1$ is more than 10%, or more than 20%, or more than 30% or more than 40% or more than 50%, or more than 60%, or more than 70%, or more than 80%, or from 10% to 90%, or from 20% to 80%, or from 30% to 70% of the length of the waveguide, L. In some embodiments, length $L_2$ is more than 5%, or more than 10%, or more than 15% or more than 20%, or more than 25% or more than 30%, or more than 35%, or more than 40%, or more than 45%, or more than 50%, or more than 55%, or more than 60%, or from 1% to 90%, or from 1% to 70%, or from 1% to 50%, or from 10% to 50%, or from 10% to 40%, or from 20% to 40% of the length of the waveguide, L.

In some embodiments, the waveguide (e.g., 205 in FIG. 2, and 305 in FIG. 3) is configured to maintain a pressure from 0.1 atm to 10 atm, or from 0.5 atm to 10 atm, or from 0.9 atm to 10 atm, or greater than 0.1 atm, or greater than 0.5 atm, or greater than 0.9 atm. In many conventional systems, the microwave chemical processing is operated at vacuum. However, in the present embodiments with the plasma being generated within the waveguide, operating in a positive pressure environment assists in preventing the generated plasma from feeding back into the microwave emitter source 204, 304.

The waveguide (e.g., 205 in FIG. 2, and 305 in FIG. 3) may have a rectangular cross-section within length $L_1$ of dimensions 0.75 inches by 3.4 inches, to correspond to a microwave radiation frequency of 2.45 GHz. Other dimensions are possible for other microwave frequencies, and dependent upon waveguide mode this can be from 3-6 inches. The waveguide may be made of any innately conductive material or a material with a sufficient conductive coated layer to propagate greater than 90% of incoming power. Some examples of waveguide materials are stainless steel, stainless steel coated with a conductive layer (e.g., Al, Ni, Au, or a Ni/Au alloy), stainless steel with an aluminum liner, or a ceramic materials coated with a conductive layer. Notably, the waveguide serves as the chamber in which the plasma is generated and the process gas reactions to occur, rather than having a separate waveguide and quartz reaction chamber as in conventional systems. Having the waveguide serve as the reactor chamber provides a much larger volume in which gas reactions can occur (e.g., up to 1000 L). This enables high flow rates of process gas to be processed, without being limited by a build-up of carbon particulate as occurs in conventional systems. For example, process gas flow rates through the inlet (e.g., 202 in FIG. 2, and 310 in FIG. 3) into the waveguide (e.g., 205 in FIG. 2, and 305 in FIG. 3) may be from 1 slm (standard liters per minute) to 1000 slm, or from 2 slm to 1000 slm, or from 5 slm to 1000 slm, or greater than 1 slm, or greater than 2 slm, or greater than 5 slm. Supply gas flow rates through the inlet (e.g., 202 in FIG. 2, and 302 in FIG. 3) into the waveguide (e.g., 205 in FIG. 2, and 305 in FIG. 3) may be, for example, from 1 slm to 1000 slm, or from 2 slm to 1000 slm, or from 5 slm to 1000 slm, or greater than 1 slm, or greater than 2 slm, or greater than 5 slm. Dependent upon the gas plasma properties that result in sufficient plasma density (e.g., secondary electron emission coefficient) the flows can be from 1 slm to 1000 slm and with pressures up to 14 atm.

In some embodiments, the process gas is a hydrocarbon, such as $C_2H_2$, $C_2H_4$, $C_2H_6$. In some embodiments, the process gas is methane, and the separated components are hydrogen and nanoparticluate carbon. In some embodiments, the process gas is carbon dioxide with water, and the separated components are oxygen, carbon and water. In some embodiments, the process gas is $H_2S$ and the separated components are hydrogen gas and sulfur. In some embodiments, the process gas does not contain carbon dioxide. In some embodiments, the process gas is a complex gas-based material, for example $SiH_4$, trimethylaluminum (TMA), trimethylgallium (TMG), glycidyl methacrylate (GMA), $SF_6$, and other materials used in the semiconductor industry for the deposition and etching of metals and dielectrics.

In some embodiments, one of the separated components is nanoparticulate carbon such as, but not limited to, carbon black, carbon nano-onions (CNOs), necked CNOs, carbon nanospheres, graphite, pyrolytic graphite, graphene, graphene nanoparticles, graphene platelets, fullerenes, hybrid fullerenes, single-walled nanotubes and multi-walled nanotubes. One or more of these nanoparticulate carbons may be produced during a particular process run.

Tuning Microwave Energy in Microwave Gas Processing Systems

Figure 4:
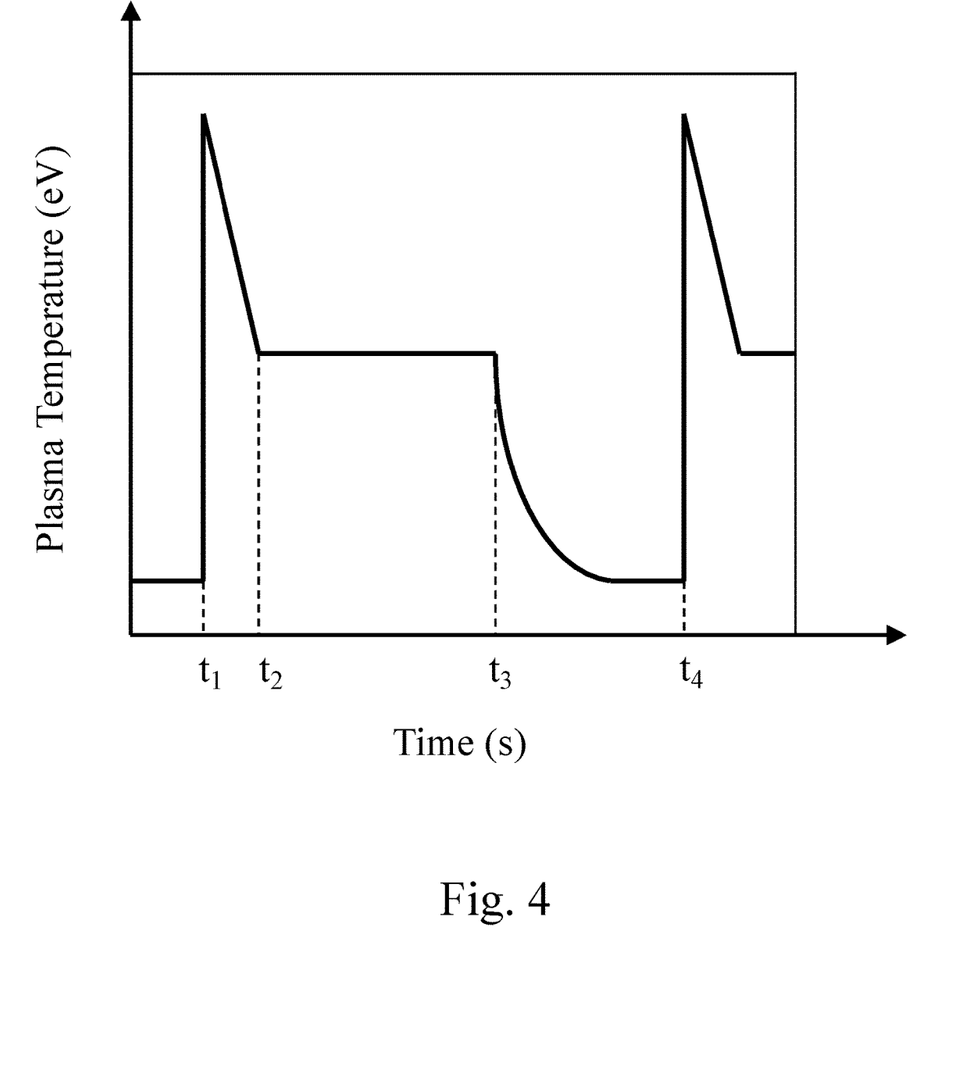
FIG. 4 is a graph of time variation of plasma temperature within a reaction chamber in accordance with embodiments of the present disclosure.
Figure 5:
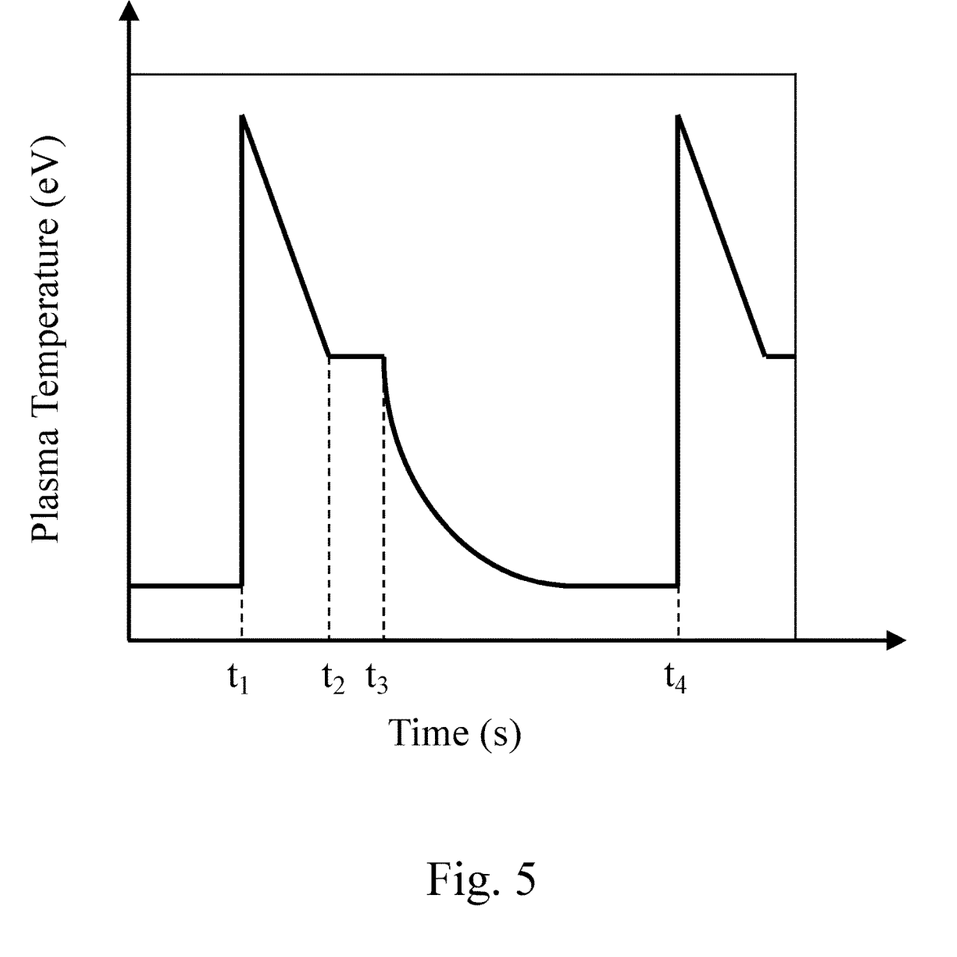
FIG. 5 is a graph of time variation of plasma temperature within a reaction chamber, where the pulsing period is shorter than that of FIG. 4.

Different process gases require different amounts of energy to react into different separated components. In the present disclosure, the available reaction pathways can be selected by changing the average energy of the plasma. In some embodiments, the microwave radiation coupled to the plasma is pulsed, and the average energy of the plasma, and therefore the reaction pathways, are selected by controlling the microwave radiation pulse duration and frequency, duty cycle, shape, and time-averaged output power level. FIGS. 4 and 5 illustrate time variations of gas temperature in the systems and methods of the present disclosure that occur due to pulsing of the microwave radiation.

FIG. 4 illustrates a typical time variation of the plasma temperature within a reaction chamber when microwave radiation that is coupled into the reaction chamber is pulsed. In FIG. 4, time $t_1$ indicates the start of a first pulse period, and time $t_4$ indicates the end of a first pulse period and the beginning of a second pulse period. Within the first pulse period, time $t_1$ to $t_3$ indicates a first duration of the pulse period where the microwave radiation is on, and time $t_3$ to $t_4$ indicates a second duration of the pulse period where the microwave radiation is off or at a lower power than during the duration when the microwave power is on. The duty cycle in this example is $(t_3-t_1)/(t_4-t_1) \times 100$, expressed as a percentage. For example, a duty cycle of 30% indicates that the microwave radiation is on for 30% of each pulse period. Upon the initiation of the first pulse, the plasma temperature quickly rises due to the excitation of the high energy species in the plasma. However, the high energy species created at the start of the pulse are relatively short lived, and the plasma temperature decreases until a steady state is reached within the plasma. Time $t_2$ indicates the time where equilibrium is reached within the plasma in the reaction chamber.

The energy in the plasma can be expressed as a plasma temperature (in units of eV), and describes the energy of the radical species in the plasma. The gas temperature in the reaction chamber or waveguide is also related to the energy of the plasma, since the energy from the plasma is transferred to the gas. Plasma efficiency is one property that affects the relationship between plasma energy and these temperatures, which is dominated by gas mixtures and types by innate gas plasma properties such as secondary electron emission coefficient, and pair production. Therefore, the average energy in the plasma between time $t_1$ and $t_2$ is higher than the average energy in the plasma at equilibrium (between times $t_2$ and $t_3$). As the total pulse period is shortened, there is a greater fraction of time where the high energy species exist within each pulse period.

In accordance with the present embodiments, FIG. 5 shows an example graph of a pulse with a period that is shorter than the example pulse depicted in FIG. 4. The pulsing may be, for example, greater than 500 Hz, such as greater than 100 kHz, and up to 1000 kHz. Since the total pulse period is shorter, but the duration of time within the pulse period where the high energy species exist is the same, the fraction of time where high energy species exist, $(t_2-t_1)/(t_4-t_1)$ is larger for the example shown in FIG. 5 than it is for the example shown in FIG. 4. The higher energy level resulting from high frequency pulsing of the microwave radiation enables more efficient cracking of the process gas molecules, by utilizing increased thermal cracking in addition to kinetic mechanisms. The increased contribution of thermal cracking results in less power input required, consequently also enabling higher flow rates of the process gas to be used. In some embodiments, the rise time and fall time of the pulse is from 5 nS to 1000 mS, or from 5 nS to 10 mS.

In some embodiments, the average energy in the plasma is controlled by changing the pulse period, by choosing a pulsing frequency to achieve a desired plasma energy. Additionally, in some embodiments, the average energy of the plasma is controlled by controlling the duty cycle. This can be understood by contemplating the situation where the time-averaged input power and the pulse period are both held constant and the duty cycle is varied. A shorter duty cycle will increase the magnitude of the power coupled into the chamber when the microwave radiation is on. That is because the time-averaged power is held constant and the duration that the power is on (i.e., the duty cycle) is shorter. In some embodiments, the higher power coupled into the reaction chamber during the first duration of the pulse period will increase the average temperature and average energy of the plasma. As previously described, controlling the energy of the plasma can be used to select given reaction pathways for the creation of separated components from a process gas. Therefore, in some embodiments, the reaction pathways can be selected by controlling the duty cycle of the microwave radiation coupled into the reaction chamber. This is advantageous because a relatively low amount of power (i.e., time-averaged power) can be used to generate reaction products from reaction pathways that would be impossible to facilitate at the same power in a continuous wave.

In some embodiments, the reaction pathways can be selected by controlling time-averaged power input into the plasma. For example, if the duty cycle and pulse frequency are held constant, and the power input into the microwave generator is increased, then the energy of the plasma will increase. By way of another example, if the duty cycle and pulse frequency are held constant, and the power is more effectively coupled into the reaction chamber, then the energy of the plasma will increase.

In some embodiments, the reaction pathways can be selected by controlling a shape of the microwave radiation pulse. In some embodiments, the microwave pulse is a rectangular wave, where the power is constant during the duration of the pulse period when the microwave is on. In some embodiments, the pulse power is not constant during the duration of the pulse period when the microwave power is on. In some embodiments, the microwave pulse is a triangular wave, or a trapezoidal wave. In some embodiments, the pulse quickly rises to a value E1 (e.g., at time $t_1$ in FIG. 5) and then increases over some period of time up to a value E2 (e.g., at time from $t_1$ to $t_2$ in FIG. 5). In some embodiments, the pulse quickly rises to a value E1 (e.g., at time $t_1$ in FIG. 5) and then linearly increases over some period of time up to a value E2 (e.g., at time from $t_1$ to $t_2$ in FIG. 5). In some embodiments, the pulse quickly rises to a value E1 (e.g., at time $t_1$ in FIG. 5), then increases over some period of time to a value E2 (e.g., at time from $t_1$ to $t_2$ in FIG. 5), and then quickly decreases to a low value E0 (e.g., from time $t_2$ to $t_3$ in FIG. 5) less than E1 and greater than the value of the energy when the microwave power is off. The plasma can be referred to as diffuse during the time period when the high energy species exist in higher fractions (i.e., at the beginning of the pulse, before the plasma reaches equilibrium). In some embodiments, the microwave energy increases over the time period where the plasma is diffuse, which increases the time average fraction of high energy species in the plasma.

As described above, tuning the pulse frequency, duty cycle, and pulse shape can enable the creation of a higher fraction of higher energy species within the plasma for a given time-averaged input power. The higher energy species can enable additional reaction pathways that would otherwise not be energetically favorable.

The techniques above can be further understood by using methane ($CH_4$) as an example process gas, to be separated into hydrogen and nanoparticulate carbon. Typically, 4-6 eV is needed to dissociate methane ($CH_4$); however, the plasma energy typically settles at approximately 1.5 eV after an initial ignition energy spike. By pulsing the microwave, the average plasma energy (i.e. time-averaged plasma energy) is maintained at the higher levels, where the frequency and duration of the pulsing controls the average plasma energy. Specifically, pulsing parameters such as frequency and duty cycle can be controlled to provide an average plasma energy of 4-6 eV to select specific dissociation reactions of the methane. Another advantage of pulsing the microwave energy is that the energy is more distributed throughout the chamber in which microwave is being input. In conventional systems, at equilibrium the plasma forms a dense layer of ionized species in the chamber towards the location of the microwave input, which absorbs the incoming microwave radiation and consequently prevents further microwave radiation from penetrating deeper into the chamber. The high frequency pulsing of the present disclosure maintains the plasma in a non-equilibrium state for a greater fraction of time and the dense layer of ionized species is present for a smaller fraction of time, which allows the microwave radiation to penetrate deeper into the chamber and the plasma to be generated in a larger volume within the chamber.

Continuing with methane as an example, at the lowest energy applied to the process gas, only one hydrogen atom would be removed, producing $CH_3$ radicals and free H atoms. When more energy is applied, the process gas including methane can be reacted into $CH_3$ radicals and free H atoms and into $CH_2$ plus $H_2$. At even higher energies, the process gas including methane can be reacted into $CH_3$ radicals and free H atoms, and into $CH_2$ plus $H_2$, and into CH radicals plus $H_2$. At even higher energies, the process gas including methane can be reacted into $CH_3$ radicals and free H atoms, and into $CH_2$ plus $H_2$, and into CH radicals plus $H_2$, and into C plus $H_2$. By controlling the amount of energy added to the plasma, different reaction pathways can be selected, and different products can be collected.

More generally, in various embodiments of the present disclosure the average energy of the plasma over the entire duration of the pulse period may be from 0.9 eV to 20 eV, or from 0.9 to 10 eV, or from 1.5 eV to 20 eV, or from 1.5 eV to 10 eV, or greater than 0.9 eV, or greater than 1.5 eV. The specific values to which the plasma energy is tuned will depend on the type of process gas being utilized.

In the microwave processing systems described above, the microwave radiation source is controlled by a microwave emitter circuit (e.g., 207 in FIG. 2, and 307 in FIG. 3), that can control the microwave radiation emitted from the source to be either continuous wave or pulsed. In some embodiments, the microwave emitter circuit produces microwave radiation through the use of a magnetron, e.g., at 915 MHz, 2.45 GHz, or 5.8 GHz. To control the output power of the microwave radiation, the microwave emitter circuit may pulse the magnetron at various frequencies and duty cycles. Each microwave emitter circuit is designed for a specific range of pulsing frequency, duty cycle, shape, and output power level, where the selection of specific values of these parameters is used to tune the chemical reaction pathways in the process gas.

In some embodiments, the microwave control circuit enables a pulse frequency from 500 Hz to 1000 kHz, or from 1 kHz to 1000 kHz, or from 10 kHz to 1000 kHz, or from 40 kHz to 80 kHz, or from 60 to 70 kHz, or greater than 10 kHz, or greater than 50 kHz, or greater than 100 kHz. In some embodiments, the microwave source emits continuous wave or pulsed microwave radiation with a time-average power from 1 to 100 kW. The pulse period has a first duration where the microwave power is on, and a second duration where the microwave radiation is off or at a lower power than during the first duration. In some embodiments, the second duration is longer than the first duration. The optimal duty cycle for a given system depends on many factors including the microwave power, pulse frequency, and pulse shape. In some embodiments, the duty cycle (i.e., the fraction of the pulse period where the microwave radiation is on, expressed as a percentage) is from 1% to 99%, or from 1% to 95%, or from 10% to 95%, or from 20% to 80%, or from 50% to 95%, or from 1% to 50%, or from 1% to 40%, or from 1% to 30%, or from 1% to 20%, or from 1% to 10%, or less than 99%, or less than 95%, or less than 80%, or less than 60%, or less than 50%, or less than 40%, or less than 30%, or less than 20%, or less than 10%.

Ion Energy Control in High Flow Microwave Gas Processing

In addition to tuning various parameters of the microwave radiation pulsing to control which chemical reaction pathways occur in the process gas, other techniques shall now be discussed that can also affect the plasma energy and therefore tune the chemical reactions.

Figure 6:
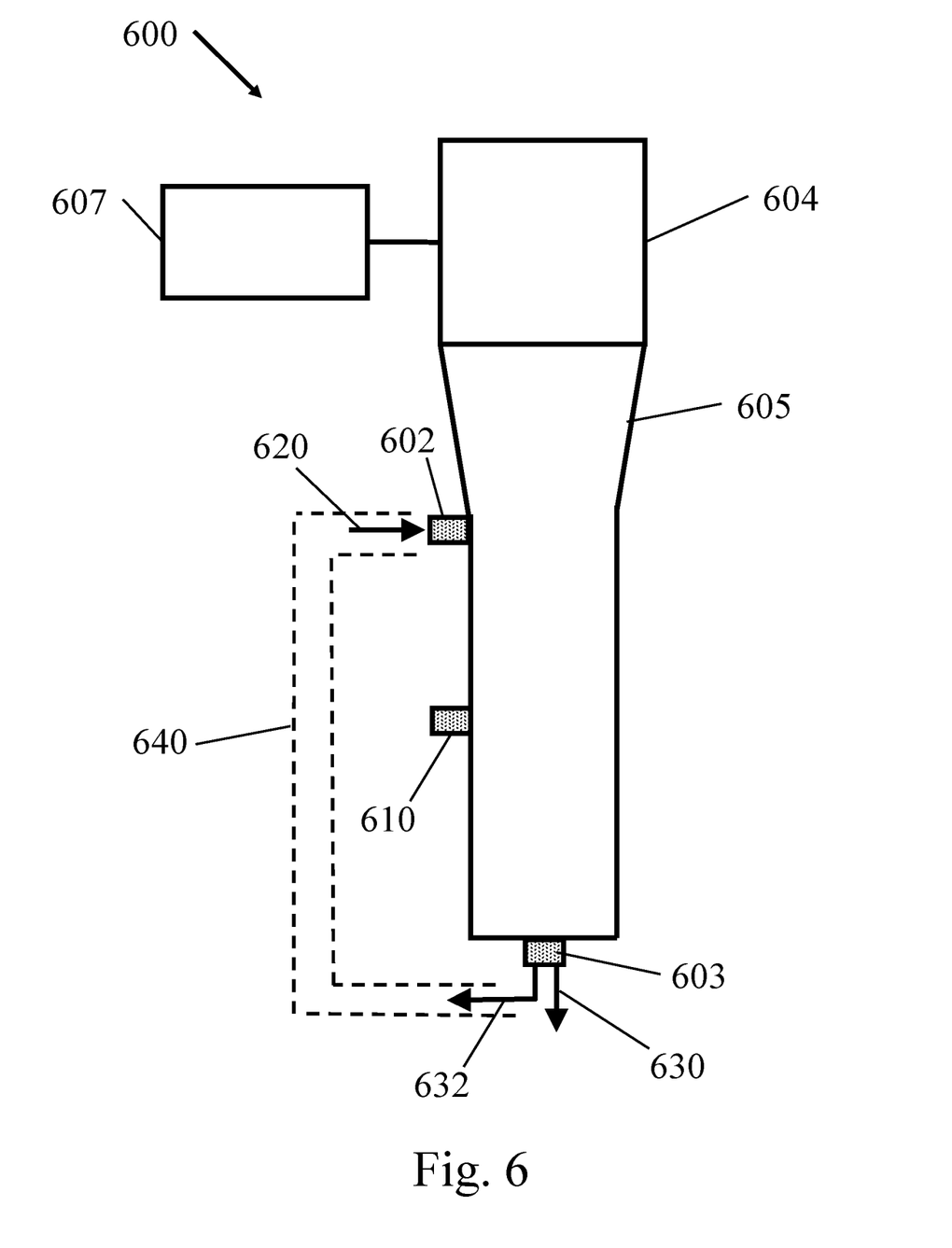
FIG. 6 is a vertical cross-section of a microwave gas processing system with precursor gas input, in accordance with embodiments of the present disclosure.

FIG. 6 illustrates controlling ion energy of the plasma through the addition of one or more precursor gases, where the precursor gases are inserted upstream from where the process gas is flowed into the waveguide chamber. Precursor gases improve cracking efficiency by adding species of various ionization potentials. That is, different gases have different ionization energies, which is the amount of energy required to remove an electron from an atom or molecule is. In addition, various gases have different pair production (how many electrons per ion can be produced) and secondary electron emission properties (emission of electrons when the charged particles strike a surface). Thus, in the present disclosure the use of precursor gases is utilized to affect the energy of the plasma.

In FIG. 6, a microwave gas processing system 600 includes a microwave radiation source 604, a waveguide 605, and a microwave emitter circuit 607 similar to previous embodiments. The diagram of FIG. 6 is a simplified drawing compared to the previous figures for clarity. A supply gas inlet 602 receives a precursor gas 620 which supplements the supply gas (not shown) to create the plasma in the waveguide. In various embodiments, the precursor gas 620 may include one or more of hydrogen, argon, helium, or various noble gases. Process gas inlet 610 is configured to receive the process gas that is to be reacted, similar to previous embodiments. For precursor gases that are not desired output products of the system (e.g., argon precursor gas in processing of methane), the precursor gases are removed from the separated components 630 and 632 that are output from outlet 603 in post-process steps.

In some embodiments, one or more of the separated components of the process gas are recycled back into the supply gas and/or process gas entering the waveguide 605. As shown in FIG. 6, gas reactions in the waveguide 605 produce separated components 630 and 632. For example, for methane as a process gas, first separated component 630 may be $CH_3$ and second separated component 632 may be atomic hydrogen $H^+$ which recombines to form $H_2$ gas before being collected at the outlet 603. Alternatively, first separated component 630 may be $CH_2$ and second separated component 632 may be hydrogen gas $H_2$. The separated component 632 is recycled back into waveguide 605 through conduit 640, back to supply gas inlet 602. The recycled separated component 632 thus is used as a precursor gas 620. Although it is counterintuitive to return the produced separated components back into the reaction system, recycling of the components adds energy to the plasma, and in some embodiments can also contribute to thermal cracking of the process gas since the recycled components have already been heated during the gas processing. In some embodiments, for example, separated component 632 can be 2-10 slm of $H_2$ that is recycled back into the waveguide 605, for a process in which a total of 150-200 slm of $H_2$ is produced. Other amounts or portions of separated component 632 may be recycled, as determined by factors such as the flow rate of the process gas, and/or the amount of energy desired to be added to the process to initiate the targeted chemical pathways.

In some embodiments, some or all of the supply gas contains one or more recycled separated components of the process gas. For example, the supply gas can be hydrogen, and the process gas can be methane, which is reacted to form hydrogen and carbon, and at least a portion of the hydrogen that is produced from the methane can be recycled and used as the supply gas. Recycling the produced hydrogen beneficially improves the efficiency of the overall gas processing because the plasma formed from the hydrogen is highly efficient at cracking hydrocarbon bonds in the process gas molecules. Additionally, in some embodiments, the recycled $H_2$ is already at a high temperature, and thus less energy input is need to achieve a thermal cracking energy. In some embodiments the supply gas is $H_2$ provided by an external source, to which recycled $H_2$ is added. In such embodiments the generated plasma is a hydrogen plasma.

Figure 7:
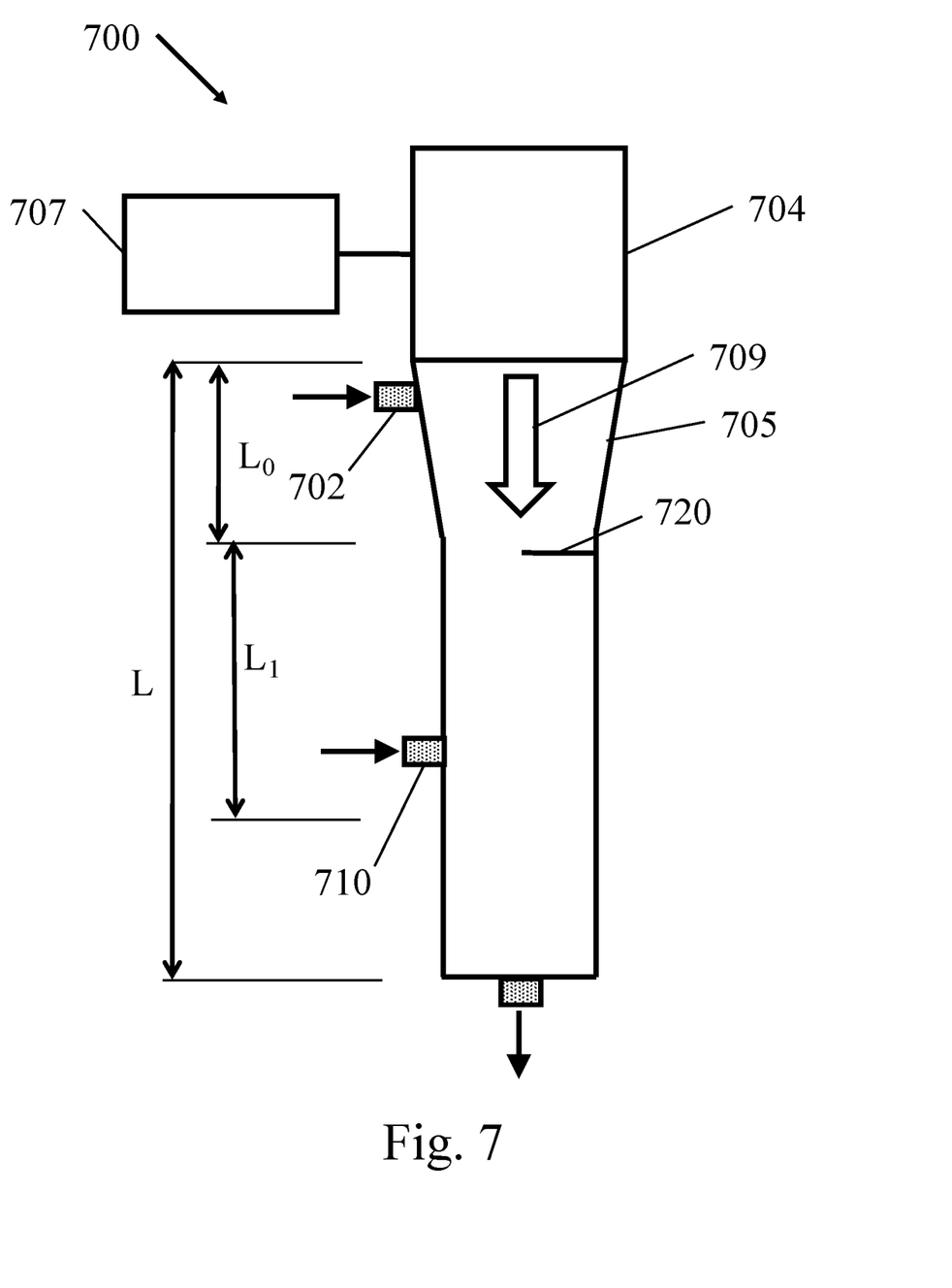
FIG. 7 is a vertical cross-section of a microwave gas processing system having a filament, in accordance with embodiments of the present disclosure.

FIG. 7 illustrates another technique for controlling the chemical pathways, through the use of filaments. In the embodiment of FIG. 7, the microwave processing system 700 includes a microwave radiation source 704, a waveguide 705, and a microwave emitter circuit 707 similar to previous embodiments. Microwave radiation 709 is supplied by the microwave radiation source 704, to propagate in a direction down the length L of the waveguide 705. In this embodiment, supply gas inlet 702 is placed near the entrance of the portion $L_0$, rather than at the entrance to the portion $L_1$ as was illustrated in previous embodiments. One or more metal filaments 720 is placed within waveguide 705 to assist in the ignition of the plasma and/or the excitation of higher energy species within the plasma. In this embodiment, metal filament 720 is downstream of the first gas inlet 702, near the entrance to the portion $L_1$ that has a constant cross-sectional area. In other embodiments, the filament 720 may be located at other locations within portion $L_1$ of the overall length L of the waveguide 705, where $L_1$ is the region in the waveguide where the plasma is formed as described in relation to previous embodiments. In some embodiments, the filament 720 is located within portion $L_1$ and upstream of the process gas inlet 710, so that it will be located outside of the portion $L_2$ (shown in FIGS. 2 and 3) where reactions are taking place and which could coat the filament with reacted species. The presence of filament 720 can reduce the plasma ignition voltage by providing an ignition site, by focusing the electric field of microwave radiation 709. Additionally, the filament 720 can become heated and emit electrons through thermionic emission, which further contributes to reducing the plasma ignition voltage. Although the filament 720 is illustrated as a single wire in this embodiment, filament 720 may take other configurations such as a coil or multiple filaments. In some embodiments, the filament 720 is tungsten. In some embodiments, the filament may be actively energized (powered) or may be passive. In some embodiments, the filament 720 is an osmium filament (e.g., configured as a plate, or coil, or other shape) adjacent to a heater coil. In some embodiments, the filament 720 is a ferrous material in the field of an inductive coil. In some embodiments, the filament 720 is actively heated where the active components (e.g. heating source components) are located outside of the waveguide 705 and the filament material that is being heated is inside of the waveguide 705.

Figure 8:
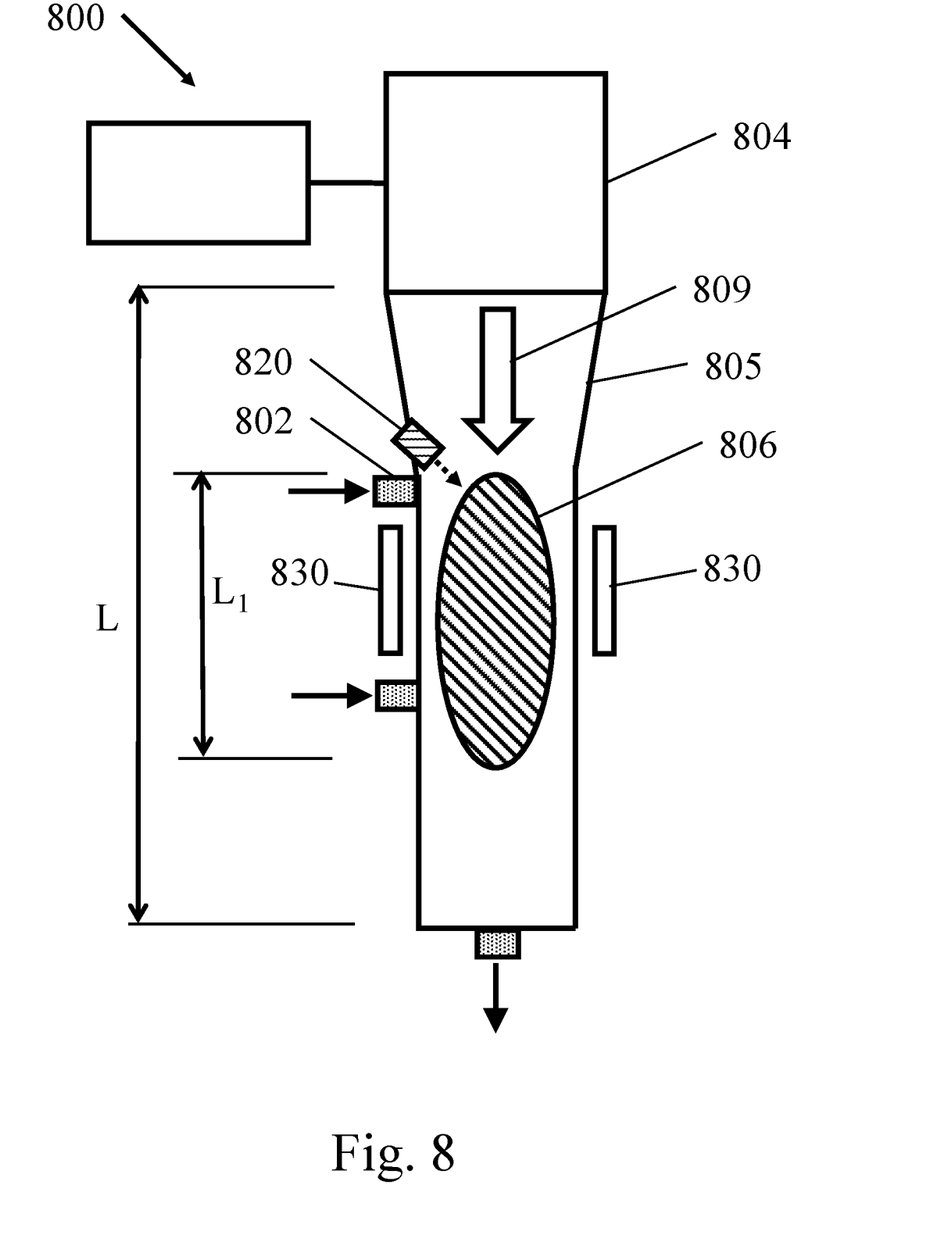
FIG. 8 is a vertical cross-section of a microwave gas processing system in which an electron source and an electrode are depicted, in accordance with embodiments of the present disclosure.

FIG. 8 illustrates yet further techniques for controlling the plasma energy, through the use of an electron source. Microwave processing system 800 includes a supply gas inlet 802, a waveguide 805, and a microwave radiation source 804 that supplies microwave radiation 809 as in previous embodiments. Microwave processing system 800 also includes one or more electron sources 820 to assist in the ignition of the plasma and/or the excitation of higher energy species within the plasma. The electron source 820 is configured to inject electrons into the waveguide 805, thereby decreasing the amount of initial energy needed to ignite the plasma. The ignition level of the plasma can therefore be controlled by controlling the amount of electrons present. In some embodiments, the electrons are injected into the portion $L_1$ of the overall length L of the waveguide 805, where $L_1$ is the region in the waveguide where the plasma is formed as described above. For example, in this embodiment the electron source 820 is configured to supply electrons into the waveguide 805 downstream of the first gas inlet 802. In some embodiments, the electron source 820 is a field emission source. In some embodiments, the electron source 820 contains an osmium element adjacent to a heater coil. In some embodiments, the electron source 820 contains a ferrous material in the field of an inductive coil. In some embodiments, the electron source 820 contains a filament, as described above, and the generated electrons are injected into the portion $L_1$ using a high voltage electric field. In some embodiments, the electron source 820 is alternatively a source of ions.

An advantage of using a filament 720 and/or an electron source 820 within the waveguide is that they enable a plasma to form quickly enough to keep up with fast microwave pulsing frequencies (e.g., at frequencies greater than 500 Hz, or greater than 1 kHz), even with high gas flows (e.g., greater than 5 slm) and large gas volumes (e.g., up to 1000 L). This is particularly important at high pressures (e.g., greater than 0.9 atm, or greater than 1 atm, or greater than 2 atm), because the high energy species will extinguish quickly in a high pressure atmosphere, and if the plasma cannot ignite fast enough, then there will be a low fraction of high-energy species (i.e., integrated over time) in a pulsed plasma at high pressures.

FIG. 8 also illustrates an embodiment of an electrode 830 in the present systems, as another technique for controlling chemical pathways. The electrode 830 may be used independently of, or in combination with, the precursor gases 620 of FIG. 6, the filaments 720 of FIG. 7 or the electron source 820 of FIG. 8. In some embodiments, the system 800 contains one or more sets of electrodes 830 to add energy to the plasma. The electrodes are configured to generate an electric field within the portion $L_1$ of the overall length L of the waveguide 805, where $L_1$ is the region in the waveguide where the plasma is formed as described above. Electrode 830 is embodied in FIG. 8 as a pair of coplanar electrodes of opposite charges, that are on the exterior of and on opposite sides of the portion of the waveguide 805 where the plasma 806 is generated. The electrodes can be energized to a particular voltage to accelerate the charged species within the plasma to a desired degree, thus controlling the plasma energy. The electrodes are particularly effective in combination with a pulsed microwave input. In conventional systems with electrodes and continuous microwave radiation, the plasma between electrodes will localize (e.g., near the electrodes) at equilibrium and screen the electric field from the electrodes, which limits the ability of the electrodes to add energy to the plasma. However, when the microwaves are pulsed, the plasma will exist in the non-equilibrium state for a larger fraction of time and will screen the electric field of the electrodes for a smaller fraction of time.

In some embodiments, the gas processing systems of the present disclosure will include magnets (not shown) to confine the plasma and reduce the ignition voltage. In some embodiments, the magnets are permanent or are electromagnets. The magnets can be positioned so the plasma density distribution can be controlled. In some embodiments, the magnets will increase the plasma density in the portion $L_1$, which will improve the efficiency by which the process gas is separated by the plasma.

As previously described, the combination of pulsed microwave radiation, high gas flows (e.g., greater than 5 slm), large volumes of plasma (e.g., up to 1000 L), high pressures (e.g., greater than 0.1 atm or greater than 0.9 atm, or greater than 2 atm), either filaments or electron sources to assist in plasma ignition at the start of each pulse, and/or electrodes to further add energy to the plasma can enable cost-effective high-productivity chemical gas processing systems, with low energy input requirements.

The gas processing systems with the above features are configured in such a way that the plasma is generated and the process gas is separated into components within the waveguide itself, such as the examples depicted in FIGS. 2, 3, 6, 7 and 8. In such systems, microwave radiation enters the system upstream of the reaction generating the separated components, and therefore the problem of the separated components building up on a microwave entry window of a reactor and absorbing the microwave radiation before it can generate the plasma is alleviated. The portion of the waveguide where the separated components are generated acts as a reaction chamber, and the supply gas flow and/or the process gas flow through the reaction chamber is parallel to the propagation direction of the microwave radiation. The microwave radiation enters the reaction chamber upstream of the portion of the reaction chamber where the separated components are generated.

In some embodiments, gas recycling, filaments, and electron sources can be used in microwave gas processing systems utilizing continuous wave (CW) microwave radiation. In embodiments with CW microwave radiation, gas recycling, filaments, and electron sources would still be advantageous to improve the gas processing efficiency of the system, reduce the ignition voltage of the plasma, and control the density distribution of the plasma.

In some embodiments, the separated components can adhere to the walls of the waveguide downstream of the reaction generating the separated components, despite the large volume of the reaction volume in the waveguide. Although this does not prevent the plasma from being generated, it still represents a loss of production and a source of contamination in the system. Therefore, in some embodiments, the gas flow of the supply gas and the process gas can be designed to generate a plasma near the areas of deposition to remove the separated products that are deposited on the waveguide walls (or, reaction chamber walls). In some embodiments, additional inlets of supply gas and/or process gas can be configured to direct the gases to the areas of deposition to remove the separated products that are deposited on the waveguide walls (or, reaction chamber walls).

Methods of Microwave Gas Processing

Figure 9:
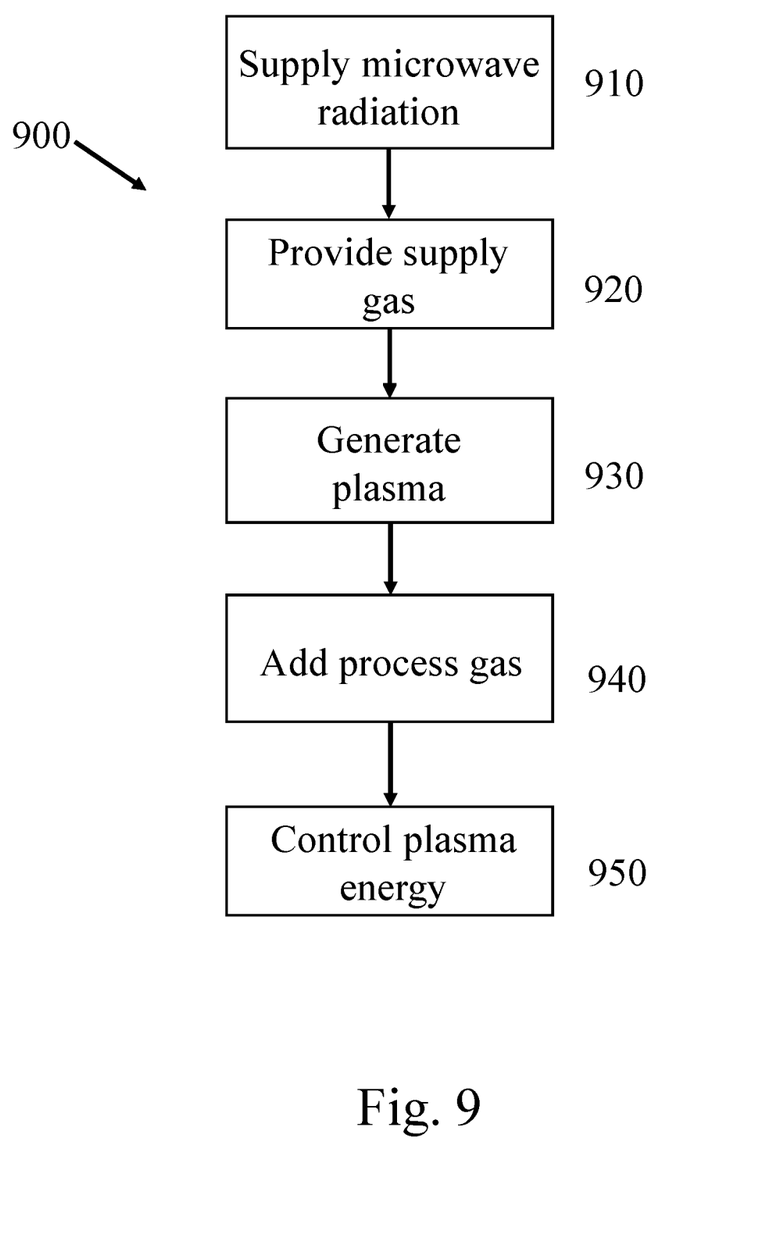
FIG. 9 is an example flow chart of methods for microwave processing of a gas in accordance with embodiments of the present disclosure.

FIG. 9 is an example flow chart 900 representing methods for microwave processing of gas, using chemistry control in high efficiency gas reactions. In step 910, microwave radiation is supplied through a waveguide having a length, where the microwave radiation propagates in a direction along the waveguide. The microwave radiation may be pulsed or continuous wave. In some embodiments, the microwave radiation is supplied into the waveguide at a power less than 100 kV. A pressure within the waveguide is at least 0.1 atmosphere, such as from 0.9 atm to 10 atm. In step 920, a supply gas is provided into the waveguide at a first location along the length of the waveguide, where a majority of the supply gas is flowing in the direction of the microwave radiation propagation. In step 930, a plasma is generated in the supply gas in at least a portion of the length of the waveguide. A process gas is added into the waveguide at step 940, at a second location downstream from the first location. A majority of the process gas flows in the direction of the microwave propagation at a flow rate of greater than 5 slm.

In step 950, an average energy of the plasma is controlled to convert the process gas into separated components. The average energy may be, for example, 0.8 eV to 20 eV. In some embodiments the pulsing frequency is controlled, where the pulsing frequency is greater than 500 Hz. For example, the pulsing frequency of the microwave radiation may be from 500 Hz to 1000 kHz. In some embodiments, the duty cycle of the pulsed microwave radiation is controlled in addition to or instead of the pulsing frequency, where the duty cycle is less than 50%.

In some embodiments, the process gas is methane, and the separated components comprise hydrogen and a nanoparticulate carbon. For example, the nanoparticulate carbon can be include one or more forms of graphene, graphite, carbon nano-onions, fullerenes or nano-tubes.

In some embodiments, a precursor gas is added to the supply gas at the first location, the precursor gas comprising hydrogen or a noble gas. In some embodiments, the separated components comprise $H_2$, and at least a portion of the separated component $H_2$ is recycled back to the first location. In such embodiments, the supply gas comprises $H_2$, and the plasma comprises a hydrogen plasma.

In various embodiments, the methods include providing a metal filament in the waveguide, the metal filament serving to reduce an ignition voltage for generating the plasma. In various embodiments, the methods include providing a pair of electrodes coupled to the waveguide, wherein the electrodes are configured to add energy to the generated plasma.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention. Furthermore, those of ordinary skill in the art will appreciate that the foregoing description is by way of example only, and is not intended to limit the invention.

What is claimed is:

1. A method comprising:
   supplying pulsed microwave radiation through a waveguide having a length, the microwave radiation propagating in a direction along the waveguide;
   providing a supply gas into the waveguide at a first location along the length of the waveguide, a majority of the supply gas flowing in the direction of the microwave radiation propagation;
   generating a plasma in the supply gas in at least a portion of the length of the waveguide;
   adding a process gas into the waveguide at a second location downstream from the first location, a majority of the process gas flowing in the direction of the microwave propagation at a flow rate of greater than 5 slm; and
   controlling an average energy of the plasma to convert the process gas into separated components by controlling at least one of the group consisting of:
     a pulsing frequency of the pulsed microwave radiation, wherein the pulsing frequency is greater than 500 Hz; and
     a duty cycle of the pulsed microwave radiation, wherein the duty cycle is less than 90%;
   wherein a pressure within the waveguide is at least 0.1 atmosphere, and
   wherein the process gas is methane, and the separated components comprise hydrogen and a nanoparticulate carbon.

2. The method of claim 1, wherein the nanoparticulate carbon comprises one or more forms of graphene, graphite, carbon nano-onions, fullerenes or nano-tubes.

3. The method of claim 1, wherein the pulsing frequency of the microwave radiation is from 500 Hz to 1000 kHz.

4. The method of claim 1, wherein the average energy of the plasma is from 0.8 eV to 20 eV.

5. The method of claim 1, wherein the pressure within the waveguide is from 0.9 atm to 10 atm.

6. The method of claim 1, wherein the microwave radiation is supplied into the waveguide at a power less than 100 kW.

7. The method of claim 1, wherein a precursor gas is added to the supply gas at the first location, the precursor gas comprising hydrogen or a noble gas.

8. The method of claim 1, wherein the separated components comprise $H_2$; and
   wherein the method further comprises recycling at least a portion of the $H_2$ of the separated components back to the first location.

9. The method of claim 8, wherein the supply gas comprises $H_2$, and the plasma comprises a hydrogen plasma.

10. The method of claim 1, further comprising providing a metal filament in the waveguide, the metal filament serving to reduce an ignition voltage for generating the plasma.

11. The method of claim 1, further comprising providing an electron source configured to supply electrons into the waveguide, thereby reducing an ignition voltage for generating the plasma.

12. The method of claim 1, further comprising providing a pair of electrodes coupled to the waveguide, wherein the electrodes are configured to add energy to the generated plasma.

* * * * *